US012772647B2

(12) United States Patent
Xie et al.

(10) Patent No.: US 12,772,647 B2
(45) Date of Patent: Oct. 20, 2026

(54) PEROVSKITE CELL AND PHOTOVOLTAIC MODULE

(71) Applicant: LONGI GREEN ENERGY TECHNOLOGY CO., LTD., Xi'an (CN)

(72) Inventors: Junjie Xie, Xi'an (CN); Zhao Wu, Xi'an (CN); Chen Xu, Xi'an (CN); Zifeng Li, Xi'an (CN); Tong Liu, Xi'an (CN); Zhuxing Sun, Xi'an (CN)

(73) Assignee: LONGI GREEN ENERGY TECHNOLOGY CO., LTD., Xi'an (CN)

( * ) Notice: Subject to any disclaimer, the term of this patent is extended or adjusted under 35 U.S.C. 154(b) by 75 days.

(21) Appl. No.: 18/294,872

(22) PCT Filed: May 10, 2022

(86) PCT No.: PCT/CN2022/091968

§ 371 (c)(1),
(2) Date: Feb. 2, 2024

(87) PCT Pub. No.: WO2023/010933

PCT Pub. Date: Feb. 9, 2023

(65) Prior Publication Data

US 2024/0251575 A1 Jul. 25, 2024

(30) Foreign Application Priority Data

Aug. 4, 2021 (CN) ........................ 202110892086.3

(51) Int. Cl.
*H10K 30/82* (2023.01)
*H10K 30/40* (2023.01)
*H10K 39/10* (2026.01)

(52) U.S. Cl.
CPC ............ *H10K 30/82* (2023.02); *H10K 30/40* (2023.02); *H10K 39/10* (2023.02)

(58) Field of Classification Search
None
See application file for complete search history.

(56) References Cited

U.S. PATENT DOCUMENTS

2009/0084438 A1 4/2009 den Boer et al.
2010/0263721 A1 10/2010 Lim et al.
(Continued)

FOREIGN PATENT DOCUMENTS

CN 102097505 6/2011
CN 103534831 1/2014
(Continued)

OTHER PUBLICATIONS

WIPO, International Search Report for International Application No. PCT/CN2022/091968, Jul. 22, 2022.
(Continued)

*Primary Examiner* — Ryan S Cannon
(74) *Attorney, Agent, or Firm* — Hodgson Russ LLP

(57) ABSTRACT

Provided are a perovskite cell and a photovoltaic module. The perovskite cell includes a perovskite light absorption layer, a first carrier transport layer, a second carrier transport layer, a first transparent electrode layer, a second transparent electrode layer, and an optical adjustment layer, wherein the optical adjustment layer is arranged between the second carrier transport layer and the second transparent electrode layer; and the transmittance of the optical adjustment layer for visible light is greater than or equal to a preset transmittance, and the reflectivity of the optical adjustment layer for infrared light is greater than or equal to a preset reflectivity.

12 Claims, 3 Drawing Sheets

(56) References Cited

U.S. PATENT DOCUMENTS

| | | | | |
|---|---|---|---|---|
| 2010/0311103 | A1* | 12/2010 | Boukherroub | C23C 14/025 436/71 |
| 2015/0255183 | A1* | 9/2015 | Kim | H10K 59/8051 428/448 |
| 2017/0229518 | A1* | 8/2017 | Uddin | H10K 30/57 |
| 2017/0365416 | A1* | 12/2017 | Padture | H10K 30/151 |
| 2020/0091355 | A1* | 3/2020 | Barr | H10F 77/707 |
| 2022/0037407 | A1* | 2/2022 | Snaith | H10K 30/57 |

FOREIGN PATENT DOCUMENTS

| | | |
|---|---|---|
| CN | 108516699 | 9/2018 |
| CN | 109671847 | 4/2019 |
| CN | 111962023 | 11/2020 |
| CN | 112614939 | 4/2021 |
| WO | 2020120991 | 6/2020 |

OTHER PUBLICATIONS

Kim et al., "Empowering Semi-Transparent Solar Cells with Thermal-Mirror Functionality," Advanced Energy Materials, 2016, vol. 6.
EPO, Communication for EP Application No. 22851652.2, Jun. 20, 2025.
CNIPA, First Office Action for CN Application No. 202110892086.3, Nov. 21, 2025.
Li et al., "Near-infrared and Ultraviolet to Visible Photon Conversion for Full Spectrum Response Perovskite Solar Cells," Nano Energy, Apr. 2018.
IPA, Office Action for AU Application No. 2025205587, May 13, 2026.

* cited by examiner

PEROVSKITE CELL AND PHOTOVOLTAIC MODULE

CROSS-REFERENCE TO RELATED APPLICATIONS

This application is a U.S. National Stage Entry under 35 U.S.C. § 371 of International Application No. PCT/CN2022/091968, filed May 10, 2022, which claims priority to Chinese Patent Application No. 202110892086.3, filed Aug. 4, 2021, the entire disclosures of which are incorporated herein by reference.

TECHNICAL FIELD

The present disclosure relates to the solar photovoltaic technology, and in particular to a perovskite cell and a photovoltaic module.

BACKGROUND

As a solar cell with a simple structure, high efficiency, and low cost, the perovskite cell has a photoelectric conversion efficiency reaching more than 25%, and is a novel solar cell that is most promising at present.

Due to the characteristics of the process and the cell structure, the perovskite cell can be fabricated as a transparent/semi-transparent cell, so as to be used in the building field, for example, as the glass of a building. Further, since the band gap of the perovskite material as the light absorption layer in the perovskite cell is in the range of 1.5 to 3.0 electron volts, the wavelength of corresponding light that can be absorbed is in the range of 414 nm to 820 nm, which substantially covers the whole visible spectrum, namely, the light absorption layer in the perovskite cell can absorb visible light in solar rays and convert the same into photo-induced carriers, thereby generating an electric current. Meanwhile, the band gap of the perovskite material can be continuously adjusted by changing the type and proportion of halogen ions in the perovskite material, so as to ensure that the perovskite material can absorb visible light of different colors, namely, the color of the perovskite cell can be continuously adjusted in a color range corresponding to the visible light, so that the perovskite cell, when applied in the building field, has the color adjustability.

However, in the existing solutions, when the perovskite cell is used in the building field, other application requirements in the building field are not taken into consideration, for example, how to ensure the requirements of heat preservation and refrigeration of a building when the perovskite cell is used as the glass of the building.

SUMMARY

The disclosure provides a perovskite cell and a photovoltaic module.

In a first aspect, an embodiment of the disclosure provides a perovskite cell including:

a perovskite light absorption layer, a first carrier transport layer, a second carrier transport layer, a first transparent electrode layer, a second transparent electrode layer, and an optical adjustment layer;

the first carrier transport layer is disposed on a light-facing side of the perovskite light absorption layer, the second carrier transport layer is disposed on a back side of the perovskite light absorption layer, and the carrier selectivity of the first carrier transport layer is opposite to the carrier selectivity of the second carrier transport layer;

the first transparent electrode layer is disposed on a side of the first carrier transport layer facing away from the perovskite light absorption layer, and the second transparent electrode layer is disposed on a side of the second carrier transport layer facing away from the perovskite light absorption layer;

the optical adjustment layer is arranged between the second carrier transport layer and the second transparent electrode layer, the second transparent electrode layer and the second carrier transport layer are electrically connected, a transmittance of the optical adjustment layer for visible light is greater than or equal to a preset transmittance, and a reflectivity of the optical adjustment layer for infrared light is greater than or equal to a preset reflectivity.

In some embodiments, the preset transmittance is 70~90% and the preset reflectivity is 60~80%.

In some embodiments, the preset transmittance is 80% and the preset reflectivity is 70%.

In some embodiments, the optical adjustment layer includes a metallic infrared reflection layer, a first protective layer and a second protective layer respectively disposed on both sides of the metallic infrared reflection layer.

In some embodiments, the metallic infrared reflection layer includes at least one of silver, aluminum, and gold, the thickness of the metallic infrared reflection layer is 1 to 30 nm:

the first protective layer and the second protective layer include at least one of aluminum oxide, silicon oxide, and silicon nitride, the thickness of the first protective layer and the second protective layer is 1 to 100 nm.

In some embodiments, the thickness of the metallic infrared reflection layer is less than 10 nm and the thickness of the first protective layer and second protective layer is less than 30 nm.

In some embodiments, the optical adjustment layer includes at least one low refractive index adjustment layer and at least one high refractive index adjustment layer:

the at least one low refractive index adjustment layer and the at least one high refractive index adjustment layer are alternatively arranged.

In some embodiments, the low refractive index adjustment layer includes a low refractive index material having a refractive index less than or equal to a first preset refractive index, the high refractive index adjustment layer includes a high refractive index material having a refractive index greater than or equal to a second preset refractive index, and the first preset refractive index is less than or equal to the second preset refractive index:

the refractive index of the low refractive index material and the high refractive index material, a thickness of the low refractive index adjustment layer and the high refractive index adjustment layer, and the number of the low refractive index adjustment layer and the high refractive index adjustment layer are determined according to the wavelength of the infrared light and the preset reflectivity.

In some embodiments, the low refractive index material includes at least one of silicon oxide, silicon oxynitride, sodium fluoride, lithium fluoride, magnesium fluoride, and calcium fluoride:

the high refractive index material includes at least one of silicon oxynitride, aluminum oxynitride, tungsten sulfide, molybdenum sulfide, lead sulfide, boron carbide, silicon carbide, aluminum antimonide, gallium antimonide, indium antimonide, bismuth selenide, molybdenum selenide, lead selenide, tungsten selenide, zinc telluride, lead telluride, and molybdenum telluride.

In some embodiments, the refractive index of the low refractive index adjustment layer is less than or equal to 1.7, the refractive index of the high refractive index adjustment layer is greater than or equal to 2.5, and the number of the low refractive index adjustment layer and the high refractive index adjustment layer is greater than or equal to 1 and less than or equal to 5.

In some embodiments, the perovskite cell further includes an up-conversion luminescence layer:

the up-conversion luminescence layer is arranged between the second carrier transport layer and the optical adjustment layer.

In some embodiments, the thickness of the up-conversion luminescence layer is less than or equal to 1000 nm:

the band gap of the up-conversion luminescence layer is greater than or equal to 3.0 electron volts.

In some embodiments, the perovskite cell further includes a conductive structure:

a via hole penetrating through the optical adjustment layer is provided in the optical adjustment layer, the conductive structure is arranged in the via hole of the optical adjustment layer, one end of the conductive structure is connected to the second carrier transport layer, and the other end of the conductive structure is connected to the second transparent electrode layer.

In some embodiments, the conductive structure includes at least one of indium-doped tin oxide, aluminum-doped zinc oxide, a metal material, and a mixed material including a plurality of metals.

In some embodiments, the perovskite light absorption layer includes at least one of an organic-inorganic halide perovskite, an all-inorganic perovskite, a lead-free perovskite, and a double perovskite:

the band gap of the perovskite light absorption layer is greater than or equal to 1.5 electron volts.

In some embodiments, the first transparent electrode layer and the second transparent electrode layer include at least one of an indium tin oxide conductive glass, a fluorine-doped tin dioxide conductive glass, and an aluminum-doped zinc oxide conductive glass:

the transmittance of the first transparent electrode layer and the second transparent electrode layer for visible light is greater than 90%, and the square resistance of the second transparent electrode layer is less than or equal to 10 ohms/square.

In a second aspect, an embodiment of the disclosure provides a photovoltaic module including any perovskite cell described above.

BRIEF DESCRIPTION OF THE DRAWINGS

In order to more clearly illustrate the technical solutions of embodiments of the disclosure, the accompanying drawings required to be used in the description of the embodiments of the disclosure will be briefly introduced below. It is apparent that the drawings in the description below are only some embodiments of the disclosure, and other drawings can be obtained by those skilled in the art based on these drawings without involving any creative effort.

LIST OF REFERENCE NUMERALS

10—perovskite light absorption layer; 20—first carrier transport layer; 30—second carrier transport layer; 40—first transparent electrode layer; 50—second transparent electrode layer; 60—optical adjustment layer; 61—metallic infrared reflection layer; 62—first protective layer; 63—first protective layer; 64—low refractive index adjustment layer; 65—high refractive index adjustment layer; 70—conductive structure; 80—up-conversion luminescence layer.

DETAILED DESCRIPTION OF THE EMBODIMENTS

The technical solutions in the embodiments of the disclosure will be clearly and completely described below with reference to the drawings in the embodiments of the disclosure. It is to be understood that the described embodiments are part of, but not all of, the embodiments of the disclosure. Based on the embodiments of the disclosure, all the other embodiments obtained by those skilled in the art without involving any creative effort fall within the scope of protection of the disclosure.

Hereinafter, several specific embodiments are enumerated to explain a perovskite cell and a production method thereof, a photovoltaic module provided in the disclosure in detail.

Figure 1:
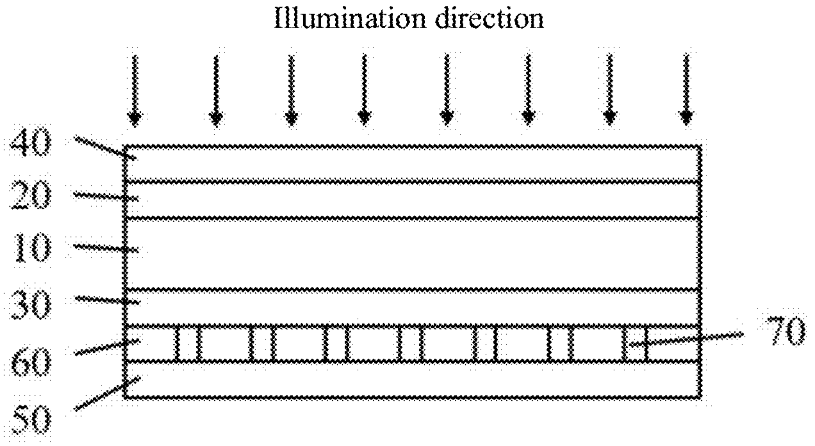
FIG. 1 is a schematic structural diagram of a perovskite cell according to an embodiment of the disclosure.

FIG. 1 is a schematic structural diagram of a perovskite cell provided by an embodiment of the disclosure. Referring to FIG. 1, the perovskite cell may include a perovskite light absorption layer 10, a first carrier transport layer 20, a second carrier transport layer 30, a first transparent electrode layer 40, a second transparent electrode layer 50, and an optical adjustment layer 60.

The perovskite cell is a solar cell having the perovskite material as a light-absorbing material, that is, the perovskite material is used as a light absorption layer in the cell to form a perovskite light absorption layer 10, and the perovskite cell is a third generation solar cell, also referred to as a new concept solar cell. Perovskite materials have the general formula ABX3, where A is a monovalent cation, B is a divalent cation and X is a halogen ion. The halogen ion is typically one or more of chloride ion ($Cl^-$), bromide ion (Br) and iodide ion (I). Perovskite materials with different halogen ions have different band gap widths. The band gap of perovskite materials with halogen ions of $I^-$ is the smallest (generally about 1.5 electron volts), and the band gap of perovskite materials with halogen ions of $Cl^-$ is the largest (generally about 3 electron volts). The perovskite material may include two kinds of mixed halogen ions, and the mixing ratio may be continuously adjusted. Therefore, the band gap of the perovskite material may be continuously adjusted in the range of 1.5 to 3 electron volts. Accordingly, the wavelength range of absorbable light is about 414 to 820 nm, which substantially covers the whole visible light spectrum.

Specifically, when the solar rays irradiate the perovskite cell, the perovskite light absorption layer 10 may absorb solar rays with a wavelength in the range of 414 nm to 820 nm in the solar rays, and carriers (electrons and holes) are generated in the perovskite light absorption layer 10.

Further, the first carrier transport layer 20 is disposed on the light-facing side of the perovskite light absorption layer 10, the second carrier transport layer 30 is disposed on the back side of the perovskite light absorption layer 10, and the carrier selectivity of the first carrier transport layer 20 is opposite to the carrier selectivity of the second carrier transport layer 30. The first transparent electrode layer 40 is disposed on a side of the first carrier transport layer 20 facing away from the perovskite light absorption layer 10, the second transparent electrode layer 50 is disposed on a side of the second carrier transport layer 30 facing away from the perovskite light absorption layer 10, and the second transparent electrode layer 50 and the second carrier transport layer 30 are electrically connected.

Specifically, the carrier selectivity of the first carrier transport layer 20 is opposite to the carrier selectivity of the second carrier transport layer 30. If the first carrier transport layer 20 has an electron selectivity and the second carrier transport layer 30 has a hole selectivity, after the perovskite light absorption layer 10 absorbs solar rays and generates carriers, the electron carriers among the carriers are selected by the first carrier transport layer 20 and transported to the first transparent electrode layer 40, and then are collected by the first transparent electrode layer 40, and the hole carriers among the carriers are selected by the second carrier transport layer 30 and transported to the second transparent electrode layer 50, and then collected by the second transparent electrode layer 50, thereby achieving the separation of the carriers in the perovskite light absorption layer 10.

Furthermore, if the first carrier transport layer 20 has a hole selectivity and the second carrier transport layer 30 has an electron selectivity, after the perovskite light absorption layer 10 absorbs solar rays and generates carriers, the hole carriers among the carriers are selected by the first carrier transport layer 20 and transported to the first transparent electrode layer 40, and then collected by the first transparent electrode layer 40, and the electron carriers among the carriers are selected by the second carrier transport layer 30 and transported to the second transparent electrode layer 50, and then collected by the second transparent electrode layer 50, thereby achieving the separation of the carriers in the perovskite light absorption layer 10.

In an embodiment of the disclosure, when the perovskite cell is applied in the building field, for example, being used as a glass or a curtain wall of a building, it is necessary to obtain a transparent perovskite cell with a certain transmittance for solar rays. Therefore, the electrode layers used for collecting different carriers in the perovskite cell can be selected as transparent electrode layers. Specifically, on the basis of the structure of an opaque perovskite cell, an transparent electrode layer may be used to replace the opaque electrode layer such as a metal electrode and a carbon electrode, so as to achieve the transparency of the perovskite cell and ensure the day lighting of the building.

Further, the perovskite cell may also include an optical adjustment layer 60 arranged between the second carrier transport layer 30 and the second transparent electrode layer 50. In other words, the optical adjustment layer 60 is arranged between the carrier transport layer and the electrode layer on a side facing away from the incident direction of solar rays of the perovskite cell, and the transmittance of the optical adjustment layer 60 for visible light is greater than or equal to a preset transmittance. Therefore, after visible light in solar rays is absorbed by the perovskite light absorption layer 10, the remained visible light portion can transmit through the optical adjustment layer 60.

In the solar spectrum corresponding to solar rays, visible light is light with a wavelength less than 760 nm, which plays a role in illuminating the internal environment of buildings, and the energy of infrared light with a wavelength greater than or equal to 760 nm accounts for more than 50% of the energy of the whole solar rays. The infrared light in the solar rays is invisible light, which does not play a role in illuminating the internal environment of buildings, but is one of the main factors leading to the increase or decrease of the internal temperature of buildings. It needs to be stated that there may be a certain difference between the wavelength boundary values of the visible light and the infrared light in different standards and regulations, for example, in some standards, light with a wavelength less than 740 nm is specified as the visible light, and light with a wavelength greater than or equal to 740 nm is specified as the infrared light. However, in some standards, light with a wavelength less than 780) nm is specified as the visible light, and light with a wavelength greater than or equal to 780 nm is specified as the infrared light. Accordingly, in an embodiment of the disclosure, the transmittance of the optical adjustment layer 60 for the visible light with a wavelength less than 760 nm may be set to be greater than or equal to a preset transmittance, and the reflectivity for the infrared light with a wavelength greater than or equal to 760 nm is set to be greater than or equal to a preset reflectivity.

In the practical life, in summer, the outside temperature of a building is greater than the indoor temperature, the indoor needs to be cooled, thus the perovskite cell installed on the building needs to reflect the infrared light in the solar rays to the outside, thereby significantly reducing the energy consumption required for indoor refrigeration; in winter, the inside temperature of a building is greater than the outside temperature, and heating is required in the room, thus the perovskite cell installed on the building needs to reflect indoor infrared light to the room to avoid indoor heat loss, thereby significantly reducing the energy consumption required for indoor heating.

Therefore, it is possible to set the reflectivity of the optical adjustment layer 60, that is arranged between the second carrier transport layer 30 and the second transparent electrode layer 50 in the perovskite cell, for the infrared light to be greater than or equal to a preset reflectivity. Accordingly, after the visible light in solar rays is absorbed by the perovskite light absorption layer 10, the infrared light in the remained rays reaches the optical adjustment layer 60 and is reflected by the optical adjustment layer 60, thereby avoiding transmission of the infrared light through the perovskite cell.

Figure 2:
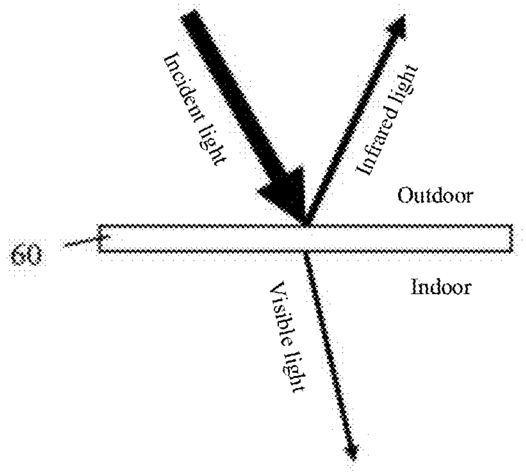
FIG. 2 is a schematic diagram illustrating a light path of an optical adjustment layer according to an embodiment of the disclosure.

FIG. 2 is a schematic diagram illustrating a light path of an optical adjustment layer provided by an embodiment of the disclosure. Referring to FIG. 2, the incident light includes the visible light and the infrared light. A part of the visible light may be absorbed by the perovskite light absorption layer 10 in the perovskite cell for photoelectric conversion, and a part of the visible light passes through the perovskite cell from the outside and enters into the room, thereby illuminating the building; however, most of the infrared light does not belong to the light that can be absorbed by the perovskite light absorption layer 10 in the perovskite cell, and cannot play a role in illuminating the internal environment of the building, and can only cause the internal temperature of the building to increase or decrease.

Therefore, assuming that the perovskite cell according to the embodiment of the disclosure is used as the glass of a building, if the incident light is solar rays radiated into the room from the outside, after the visible light in the incident light is absorbed by the perovskite light absorption layer 10, since the transmittance of the optical adjustment layer 60 for the visible light is greater than or equal to the preset transmittance, the remained visible light can transmit through the optical adjustment layer 60 and enter the room, thereby ensuring the day lighting and illumination of the building. On the other hand, most of the infrared light in the incident light does not belong to the light that can be absorbed by the perovskite light absorption layer 10, and therefore, most of the infrared light in the incident light passes through the perovskite light absorption layer 10 to reach the optical adjustment layer 60. Moreover, since the reflectivity of the optical adjustment layer 60 for the infrared light is greater than or equal to the preset reflectivity, the infrared light in the incident light is reflected by the optical adjustment layer 60 to the outside and fails to enter the room. It can be seen therefrom that in summer, by using the perovskite cell with the optical adjustment layer 60 as the glass of the building, the perovskite cell is ensured to absorb the visible light in the incident light to perform a normal photoelectric conversion, meanwhile, the day lighting and illumination of the building can also be ensured, and the outdoor infrared light is ensured to not penetrate the perovskite cell into the room, so as to realize energy isolation, avoid the infrared light from bringing the outdoor scorching heat into the room, thereby reducing the energy consumption required for refrigeration inside the building.

Figure 3:
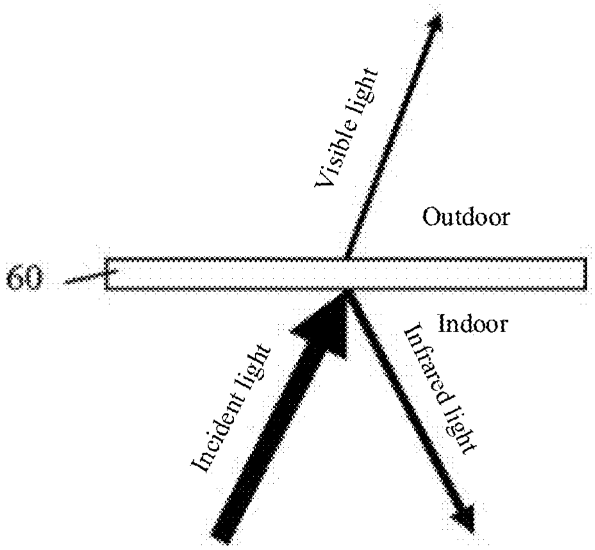
FIG. 3 is a schematic diagram illustrating another light path of an optical adjustment layer according to an embodiment of the disclosure.

FIG. 3 is a schematic diagram illustrating another light path of an optical adjustment layer provided in an embodiment of the disclosure. Referring to FIG. 3, assuming that the perovskite cell in the embodiment of the disclosure is used as the glass of a building, if the incident light is light irradiated outside from the room, since the transmittance of the optical adjustment layer 60 for the visible light is greater than or equal to the preset transmittance, the visible light of the incident light can transmit through the optical adjustment layer 60 to irradiate the perovskite light absorption layer; moreover, since the reflectivity of the optical adjustment layer 60 for the infrared light is greater than or equal to the preset reflectivity, the infrared light in the incident light is reflected into the room by the optical adjustment layer 60 and fails to be emitted outside. It can be seen therefrom that in winter, by using the perovskite cell with the optical adjustment layer 60 as the glass of the building, the perovskite cell is ensured to absorb the visible light in the incident light to perform the normal photoelectric conversion, meanwhile, the day lighting and illumination of the building can be ensured, and the indoor infrared light is ensured to not penetrate the perovskite cell and emit to the outside, so as to realize energy isolation, avoid the indoor heat loss caused by the infrared light emitting to the outside, thereby reducing the energy consumption required for the heating inside the building.

As can be seen, the optical adjustment layer 60 in the perovskite cell only adjusts the infrared light in the incident light so as to avoid more infrared light penetrating the perovskite cell, and has a certain transmittance for the visible light, thereby ensuring the illumination and day lighting of the building. Moreover, the influence on the visible light absorption process of the perovskite light absorption layer 10 is also avoided, thereby ensuring the conversion efficiency of the perovskite cell.

Here, the preset transmittance may be a transmittance for the visible light preset by the optical adjustment layer 60 to ensure a high conversion efficiency of the perovskite light absorption layer 10 in the perovskite cell, for example 70~90%. The preset reflectivity may be a reflectivity for the infrared light preset by the optical adjustment layer 60 to ensure that the perovskite cell has a certain isolation effect on the infrared light, for example, 60~80%.

In the embodiment of the disclosure, the perovskite cell includes a perovskite light absorption layer, a first carrier transport layer, a second carrier transport layer, a first transparent electrode layer, a second transparent electrode layer and an optical adjustment layer; the first carrier transport layer is disposed on the light-facing side of the perovskite light absorption layer, the second carrier transport layer is disposed on the back side of the perovskite light absorption layer, and the carrier selectivity of the first carrier transport layer is opposite to the carrier selectivity of the second carrier transport layer; the first transparent electrode layer is disposed on a side of the first carrier transport layer facing away from the perovskite light absorption layer, and the second transparent electrode layer is disposed on a side of the second carrier transport layer facing away from the perovskite light absorption layer; the optical adjustment layer is arranged between the second carrier transport layer and the second transparent electrode layer; and the transmittance of the optical adjustment layer for the visible light is greater than or equal to a preset transmittance, and the reflectivity of the optical adjustment layer for the infrared light is greater than or equal to a preset reflectivity. In the disclosure, a transparent perovskite cell composed of a first transparent electrode layer and a second transparent electrode layer may be applied in the building field, and an optical adjustment layer is arranged between the second carrier transport layer and the second transparent electrode layer in the perovskite cell; since the transmittance of the optical adjustment layer for the visible light is greater than or equal to the preset transmittance, the efficiency of the perovskite cell and the day lighting requirements of the building can be ensured. Moreover, the energy of the infrared light accounts for more than 50% of the energy of the whole solar spectral energy, and it is one of the main factors leading to the increase or decrease of the internal temperature of a building, thus, when the reflectivity of the optical adjustment layer for the infrared light is greater than or equal to the preset reflectivity, the heat preservation and refrigeration requirements of the building can be ensured, thereby reducing the energy consumption of the building due to the heat preservation and refrigeration requirements.

In some embodiments, the preset transmittance may be 80% and the preset reflectivity may be 70%. When the transmittance of the visible light is greater than 80%, the requirements of day lighting for buildings can be met, and it is not necessary to increase the indoor illumination in the case of good daytime sunshine, which will not result in the increase of the energy consumption of additional illumination. Moreover, when the reflectivity of the infrared light is greater than 70%, the optical adjustment film can block most of the energy in the non-visible light region, and the energy is transferred from the high-temperature side to the low-temperature side through thermal radiation, i.e, the indoor refrigeration energy consumption can be reduced when the outdoor temperature is high in summer, and the indoor heating energy consumption can be reduced when the outdoor temperature is low in winter.

Figure 4:
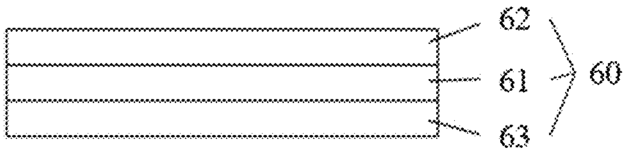
FIG. 4 is a schematic structural diagram of an optical adjustment layer according to an embodiment of the disclosure.

In some embodiments. FIG. 4 is a schematic structural diagram of an optical adjustment layer provided by an embodiment of the disclosure. Referring to FIG. 4, the optical adjustment layer 60 may include a metallic infrared reflection layer 61, a first protective layer 62 and a second protective layer 63 disposed on both sides of the metallic infrared reflection layer 61 respectively.

The metallic infrared reflection layer 61 is a layer having a function for reflecting infrared spectrum, and can be made of a metal material with a relatively high reflectivity for the infrared light, so that the optical adjustment layer 60 has a relatively high reflectivity for the infrared light. The first protective layer 62 and the second protective layer 63 respectively disposed on both sides of the metallic infrared reflection layer 61 are protective layers of the metallic infrared reflection layer 61, which can protect the metallic infrared reflection layer 61 from mechanical loss and chemical corrosion of the metallic infrared reflection layer 61 in the subsequent preparation process of the perovskite cell. The first protective layer 62 and the second protective layer 63 are generally made of a dielectric material with higher chemical stability and higher light transmittance.

In some embodiments, the metallic infrared reflection layer 61 in the optical adjustment layer 60 may include at least one of silver, aluminum, and gold, and a metal material such as silver, aluminum, and gold has a reflectivity greater than 90% in the infrared waveband. Moreover, the thickness of the metallic infrared reflection layer 61 may be 1~30 nm to ensure that the light transmittance of the metallic infrared reflection layer 61 will not decrease due to the excessive thickness. Preferably, the thickness of the metallic infrared reflection layer 61 is less than 10 nm. In addition, an increase in the metal granularity in the metallic infrared reflection layer 61 will lead to an increase in scattering, resulting in a decrease in the reflectivity of the optical adjustment layer 60 formed by the metallic infrared reflection layer 61.

The first protective layer 62 and the second protective layer 63 may include at least one of aluminum oxide, silicon oxide, and silicon nitride, and the thickness of the first protective layer 62 and the second protective layer 63 may be 1~100 nm to avoid that the protection is not performed by the first protective layer 62 and the second protective layer 63 due to being too thin, or the transmittance of the optical adjustment layer 60 for the visible light is reduced due to the first protective layer 62 and the second protective layer 63 being too thick. Preferably, the thickness of the first protective layer 62 and the second protective layer 63 is less than 30 nm.

In an embodiment of the disclosure, other functional layers may also be disposed between the first protective layer 62 and the metallic infrared reflection layer 61, or between the second protective layer 63 and the metallic infrared reflection layer 61, for example, an oxidation-resistant layer for preventing metal oxidation in the metallic infrared reflection layer 61, a color modulation layer for adjusting color, etc. may be disposed.

Figure 5:
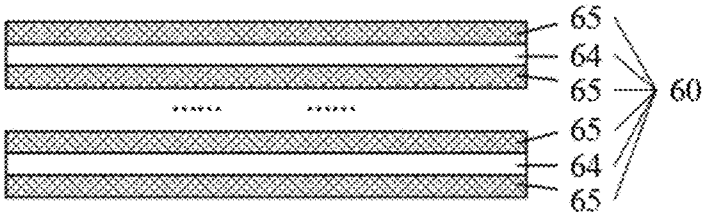
FIG. 5 is a schematic structural diagram of another optical adjustment layer according to an embodiment of the disclosure.

In some embodiments. FIG. 5 is a schematic structural diagram of another optical adjustment layer provided by an embodiment of the disclosure. Referring to FIG. 5, the optical adjustment layer 60 may include at least one low refractive index adjustment layer 64 and at least one high refractive index adjustment layer 65 that are alternately arranged.

According to the optical theory, a high refractive index adjustment layer 65 with a relatively large refractive index and a low refractive index adjustment layer 64 with a relatively small refractive index may be stacked in sequence and arranged in a structure as shown in FIG. 5, thereby constructing an optical adjustment layer 60 having a super-structure type reflective structure film system. Furthermore, an optical adjustment layer 60 with a specific reflectivity for light of a specific wavelength can be constructed by adjusting the parameters such as the refractive index of the high refractive index material contained in the high refractive index adjustment layer 65, the refractive index of the low refractive index material contained in the low refractive index adjustment layer 64, the thickness of the high refractive index adjustment layer 65 and the low refractive index adjustment layer 64, and the quantity of stacked layers in the film system structure.

In some embodiments, the low refractive index adjustment layer 64 in the optical adjustment layer 60 may contain a low refractive index material with a refractive index less than or equal to a first preset refractive index, and the high refractive index adjustment layer 65 may contain a high refractive index material with a refractive index greater than or equal to a second preset refractive index, and the first preset refractive index is less than or equal to the second preset refractive index, i.e, the refractive index of the low refractive index material constituting the low refractive index adjustment layer 64 is less than the refractive index of the high refractive index material constituting the high refractive index adjustment layer 65.

In the embodiment of the disclosure, for the optical adjustment layer 60 of a multilayer structure including at least one low refractive index adjustment layer 64 and at least one high refractive index adjustment layer 65, when incident light with wavelength λ is incident on the optical adjustment layer 60 with the multilayer structure at an incident angle $\Phi_0$, the following formula can be constructed according to the Fresnel equation for the multilayer optical structure;

$$\begin{bmatrix} A & B \\ C & D \end{bmatrix} = \begin{bmatrix} \cos\delta_1 & i\left(\frac{1}{\omega_1}\right)\sin\delta_1 \\ i\omega_1\sin\delta_1 & \cos\delta_1 \end{bmatrix} \begin{bmatrix} \cos\delta_2 & i\left(\frac{1}{\omega_2}\right)\sin\delta_2 \\ i\omega_2\sin\delta_2 & \cos\delta_2 \end{bmatrix} \cdots \begin{bmatrix} \cos\delta_m & i\left(\frac{1}{\omega_n}\right)\sin\delta_m \\ i\omega_m\sin\delta_m & \cos\delta_m \end{bmatrix} \quad (1)$$

$$\delta_i = \frac{2\pi}{\lambda} n_i \cos\phi_i \quad (2)$$

$$\omega_i = n_i \cos\phi_i \quad (3)$$

$$R = \left| \frac{\omega_0 A + \omega_0\omega_g B - C - \omega_g D}{\omega_0 A + \omega_0\omega_g B + C + \omega_g D} \right|^2 \quad (4)$$

where

λ indicates the wavelength of the incident light;

$\varphi_i$ indicates the incident angle of the incident light on the $i^{th}$ layer structure in the optical adjustment layer;

m indicates a number of the low refractive index adjustment layer and the high refractive index adjustment layer in the optical adjustment layer;

$n_i$ indicates the refractive index of the $i^{th}$ layer structure in the optical adjustment layer;

$\delta_i$ indicates a phase difference of the reflected light wave of the $i^{th}$ layer structure in the optical adjustment layer;

$\omega_i$ indicates an angular component of the refractive index of the $i^{th}$ layer structure in the optical adjustment layer in the horizontal direction;

$\omega_0$ indicates an angular component of the refractive index of air in the horizontal direction;

$\omega_g$ indicates the angular component of the refractive index, in the horizontal direction, of a substrate structure (the second transparent electrode layer) corresponding to the optical adjustment layer;

R indicates the reflectivity of the optical adjustment layer.

Specifically, when an incident light with a wavelength $\lambda$ is incident on the optical adjustment layer 60 including m layers at an incident angle $\Phi_0$, firstly, the incident angle $\varphi_i$ indicating the incident angle of the incident light on the $i^{th}$ layer structure in the optical adjustment layer can be determined according to the incident angle $\Phi_0$, and $\delta_i$ is calculated by substituting $\lambda$, $n_i$ and $\varphi_i$ into Formula (2), and $\omega_i$ is calculated by substituting $\lambda$, $n_i$ and $\varphi_i$ into Formula (3). The values of A, B, C, and D in the matrix are then determined by substituting the calculated $\delta_i$ and $\omega_i$ into Formula (1). Finally, substituting A, B, C, D, $\omega_0$ and $\omega_g$ into Formula (4), the reflectivity R of the optical adjustment layer 60 with an m-layer structure for the incident light of wavelength $\lambda$ can be determined.

The reverse is also true, according to the above-mentioned calculation process, after determining the wavelength of the incident light to which the optical adjustment layer 60 is directed and the reflectivity of the optical adjustment layer 60 for the incident light, the multilayer structure of the optical adjustment layer 60 can be inversely calculated and designed, and the number of the low refractive index adjustment layer and the high refractive index adjustment layer included in the optical adjustment layer 60, the refractive index of the low refractive index adjustment layer and the high refractive index adjustment layer can be determined. Further, after the refractive index to be possessed by the low refractive index adjustment layer is determined, the refractive index corresponding to the low refractive index material included in the low refractive index adjustment layer and the thickness of the low refractive index adjustment layer can be determined according to the refractive index of the low refractive index adjustment layer, so that the low refractive index adjustment layer constituted by the low refractive index material of the thickness has a corresponding refractive index. Similarly, after the refractive index to be possessed by the high refractive index adjustment layer is determined, the corresponding refractive index of the high refractive index material included in the high refractive index adjustment layer and the thickness of the high refractive index adjustment layer may be determined according to the refractive index to be possessed by the high refractive index adjustment layer, so that the high refractive index adjustment layer constituted by the high refractive index material of the thickness has the corresponding refractive index.

Therefore, in the embodiment of the disclosure, since the reflectivity of the optical adjustment layer 60 for the infrared light needs to be greater than or equal to a preset reflectivity, the refractive index corresponding to the low refractive index material and the high refractive index material in the optical adjustment layer 60 can be determined according to the wavelength of the infrared light and the preset reflectivity. i.e. determining the type of the low refractive index material and the high refractive index material, the thickness of the low refractive index adjustment layer and the high refractive index adjustment layer, and the number of the low refractive index adjustment layer and the high refractive index adjustment layer.

In some embodiments, the low refractive index material constituting the low refractive index adjustment layer 64 may include at least one of silicon oxide, silicon oxynitride, sodium fluoride, lithium fluoride, magnesium fluoride, and calcium fluoride. The high refractive index material constituting the high refractive index adjustment layer 65 may include at least one of silicon oxynitride, aluminum oxynitride, tungsten sulfide, molybdenum sulfide, lead sulfide, boron carbide, silicon carbide, aluminum antimonide, gallium antimonide, indium antimonide, bismuth selenide, molybdenum selenide, lead selenide, tungsten selenide, zinc telluride, lead telluride, and molybdenum telluride.

In some embodiments, based on theoretical calculations, if a condition that a reflectivity for the infrared light is greater than or equal to 60~80% is met, the corresponding optical adjustment layer 60) may be configured as follows; the refractive index of the low refractive index adjustment layer 64 is less than or equal to 1.7; the refractive index of the high refractive index adjustment layer 65 is greater than or equal to 2.5; and the number of the low refractive index adjustment layer 64 and the high refractive index adjustment layer 65, i.e, the number of stacked layers is greater than or equal to 1 and less than or equal to 5. In addition, the higher the number of the stacked layers of the low refractive index adjustment layer 64 and the high refractive index adjustment layer 65 is, the higher the reflectivity of the optical adjustment layer 60 is, while the lower the transmittance of the optical adjustment layer 60 is, that is, if the number of stacked layers of the low refractive index adjustment layer 64 and the high refractive index adjustment layer 65 is too large, the transmittance of light will be reduced.

Note that the transmittance of the optical adjustment layer 60 for the visible light and the reflectivity of the optical adjustment layer 60 for the infrared light are fixed values and do not change after the structures and materials of each layer in the optical adjustment layer 60 are determined.

Figure 6:
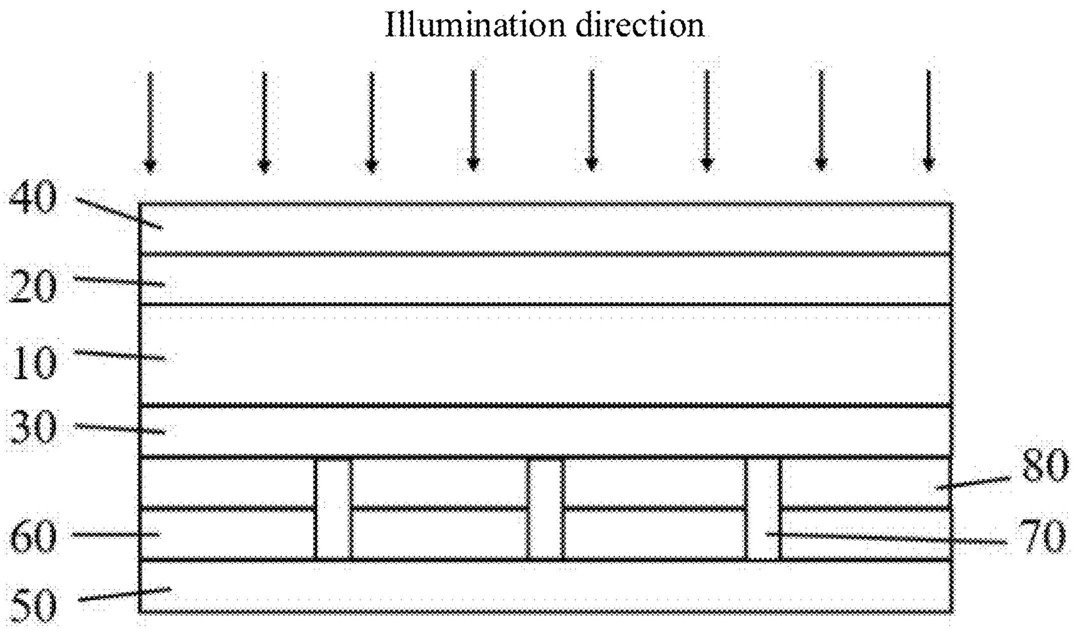
FIG. 6 is a schematic structural diagram of another perovskite cell according to an embodiment of the disclosure.

In some embodiments. FIG. 6 is a schematic structural diagram of another perovskite 20) cell provided by an embodiment of the disclosure. Referring to FIG. 6, the perovskite cell may further include an up-conversion luminescence layer 80.

The up-conversion luminescence layer 80 is arranged between the second carrier transport layer 30 and the optical adjustment layer 60. The up-conversion luminescence layer 80 has an up-conversion luminescence function, i.e, two or more low-energy photons can be successively excited to a high-energy state based on the conversion function, and then one 25 high-energy photon is emitted.

Referring to FIG. 6, solar rays are incident on the perovskite cell in the illumination direction, and most of the infrared light in the solar rays will not be absorbed by the perovskite light absorption layer 10. When the infrared light passes through the optical adjustment layer 60, the infrared light is reflected by the optical adjustment layer 60 and passes through the up-conversion luminescence layer 80; and low-energy infrared photons in the reflected infrared light can be absorbed by the up-conversion luminescence layer 80, converted and emitted high-energy visible light photons. The visible light photons can be further absorbed and reused by the perovskite light absorption layer 10, so that the spectrum utilization rate of the perovskite cell can be improved and the energy conversion efficiency of the perovskite cell can be improved.

It should be noted that the up-conversion luminescence layer 80 is arranged between the second carrier transport layer 30 and the optical adjustment layer 60. i.e., the up-conversion luminescence layer 80 and the optical adjustment layer 60 are arranged between the second carrier transport layer 30 and the second transparent electrode layer 50, thus the second transparent electrode layer 50 and the second carrier transport layer 30 can be electrically connected by perforating the up-conversion luminescence layer 80 and the optical adjustment layer 60 or by external electrical connections.

In some embodiments, the thickness of the up-conversion luminescence layer 80 may be less than or equal to 1000 nm. If the thickness of the up-conversion luminescence layer 80 is too large, it is adverse to transmission of the visible light, and it is also not advantageous to perforate the up-conversion luminescence layer 80 later to prepare a conductive structure, etc.

In addition, the band gap of the up-conversion luminescence layer 80 may be greater than or equal to 3.0 electron volts to ensure that the up-conversion luminescence layer 80 does not absorb the visible light.

In some embodiments, referring to FIG. 1 and FIG. 6, the perovskite cell may further include a conductive structure 70.

Specifically, most of the materials commonly used by the optical adjustment layer 60 and the up-conversion luminescence layer 80 are materials with poor conductivity. Therefore, in order to ensure that charges can be efficiently transferred between the second transparent electrode layer 50 and the second carrier transport layer 30, a via hole penetrating through the optical adjustment layer 60 may be provided in the optical adjustment layer 60, and the conductive structure 70 is disposed in the via hole of the optical adjustment layer 60, such that one end of the conductive structure 70 is connected to the second carrier transport layer 30, and the other end of the conductive structure 70 is connected to the second transparent electrode layer 50, thereby ensuring that the second transparent electrode layer 50 and the second carrier transport layer 30 are electrically connected.

Likewise, when the up-conversion luminescence layer 80 is arranged in the perovskite cell, a via hole penetrating through the optical adjustment layer 60 and the up-conversion luminescence layer 80 may be provided in the optical adjustment layer 60 and the up-conversion luminescence layer 80, and the conductive structure 70 is disposed in the via hole of the optical adjustment layer 60 and the up-conversion luminescence layer 80, such that one end of the conductive structure 70 is connected to the second carrier transport layer 30, and the other end of the conductive structure 70 is connected to the second transparent electrode layer 50, thereby ensuring that the second transparent electrode layer 50 and the second carrier transport layer 30 are electrically connected.

In some embodiments, the conductive structure 70 in the perovskite cell may include at least one of indium-doped tin oxide (ITO), aluminum-doped zinc oxide (AZO), a metal material, and a mixed material containing a plurality of metals. Further, the material of the conductive structure 70 may be the same as or different from the conductive material in the second transparent electrode layer 50.

In some embodiments, the perovskite light absorption layer 10 may include at least one of an organic-inorganic halide perovskite, an all-inorganic perovskite, a lead-free perovskite, and a double perovskite.

Meanwhile, due to the requirement of application in the scene of building window glass, the perovskite cell needs to have a certain light transmittance, so as to meet the daily indoor day lighting requirements. Thus, the band gap of the perovskite light absorption layer 10 in the perovskite cell may be greater than or equal to 1.5 electron volts to ensure that the band gap of the perovskite light absorption layer 10 is not too narrow; resulting in too wide a light absorbing range of the perovskite light absorption layer 10 to avoid affecting the light transmission of the perovskite cell.

In addition, it is preferable to prepare the perovskite light absorption layer 10 using an all-inorganic perovskite, such as $CsPbI_3$, $CsPbI_2Br$, $CsPbBr_3$, etc. Since the stability of the all-inorganic perovskite is high, it is possible to ensure better stability of the perovskite cell when the perovskite cell is applied to a window glass of a building.

In some embodiments, the first transparent electrode layer 40 and the second transparent electrode layer 50 in the perovskite cell may include at least one of an indium tin oxide (ITO) conductive glass, a fluorine-doped tin dioxide (FTO) conductive glass and an aluminum-doped zinc oxide (AZO) conductive glass, so that the transmittance of the first transparent electrode layer 40 and the second transparent electrode layer 50 for the visible light is greater than 90%. Moreover, the square resistance of the second transparent electrode layer 50 is less than or equal to 10 ohms/square, so that the second transparent electrode layer 50 also have better conductivity while having a certain transmittance.

Several specific examples are listed below to illustrate the structure of the perovskite cell in an embodiment of the disclosure.

Example 1

Figure 7:
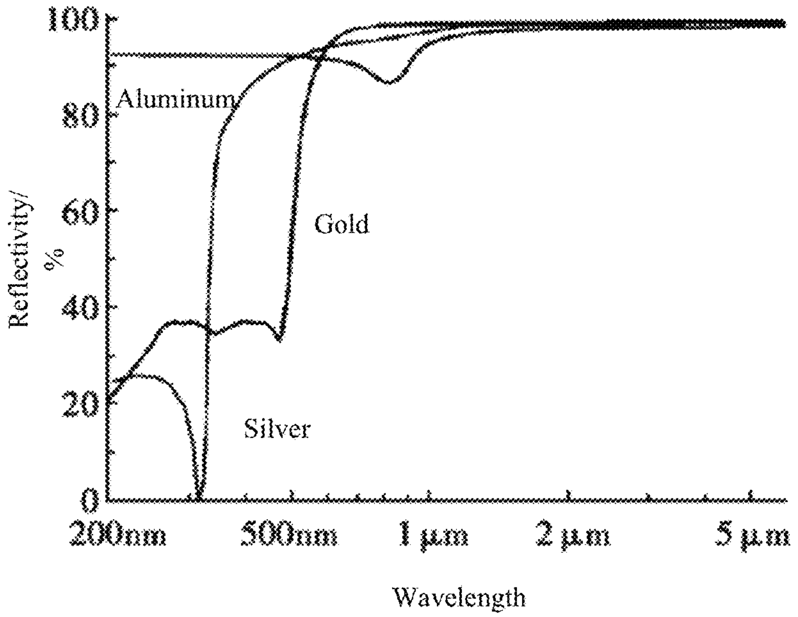
FIG. 7 is a curve graph of the reflectivity of a metallic infrared reflection layer according to an embodiment of the disclosure.

(1) a transparent conductive substrate formed with the "2.2 mm-14" FTO conductive glass from Wuhan Jingge corporation is used as the second transparent electrode layer 50, and the transmittance of the second transparent electrode layer 50 is 90%;

(2) a tin dioxide (SnO2) electron transport layer is used as the first carrier transport layer 20, and the thickness thereof is 50 nm;

(3) a CsPbI3 perovskite is used as the perovskite light absorption layer 10, the band gap of the perovskite light absorption layer 10 is 1.73 electron volts, and the thickness of the perovskite light absorption layer 10 is 600 nm;

(4) a 2, 2', 7, 7'-tetrakis [N, N-bis (4-methoxyphenyl) amino]-9, 9'-spiro-OMeTAD hole transport layer is used as the second carrier transport layer 30, and the thickness of the second carrier transport layer 30 is 150 nm;

(5) ITO is used as the first transparent electrode layer 40, and the thickness of the first transparent electrode layer 40 is 300 nm;

(6) the optical adjustment layer 60 adopts a structural design as shown in FIG. 4, among them, the first protective layer 62 is made of titanium dioxide (TiO2) with a thickness of nm, the second protective layer 63 is made of zirconium dioxide (ZrO2) with a thickness of nm, and the metallic infrared reflection layer 61 adopts aluminum with a thickness of 5 nm as an active layer for infrared reflection; FIG. 7 is a curve graph of the reflectivity of a metallic infrared reflection layer in an embodiment of the disclosure; referring to FIG. 7, the reflectivity of aluminum films with a thickness of 5~10 nm for infrared light reaches 90% or more.

(7) The optical adjustment layer 60 is punched via laser to obtain via holes, a pore diameter of the via hole is 5 μm, a pitch between the via holes is 50 μm, and the via hole is filled with ITO to form the conductive structure 70.

Example 2

(1) a transparent conductive substrate formed with the "2.2 mm-14" FTO conductive glass from Wuhan Jingge corporation is used as the second transparent electrode layer 50, and the transmittance of the second transparent electrode layer 50 is 90%;

(2) a 2, 2', 7, 7'-tetrakis [N, N-bis (4-methoxyphenyl) amino]-9, 9'-spiro-OMeTAD hole transport layer is used as the first carrier transport layer 20, and the thickness of the first carrier transport layer 20 is 100 nm;

(3) a CsPbI3 perovskite is used as the perovskite light absorption layer 10, the band gap of the perovskite light absorption layer 10 is 1.73 electron volts, and the thickness of the perovskite light absorption layer 10 is 600 nm;

(4) C60 is used as the second carrier transport layer 30, and the thickness of the second carrier transport layer 30 is 30 nm;

(5) ITO is used as the first transparent electrode layer 40, and the thickness of the first transparent electrode layer 40 is 100 nm;

(6) the optical adjustment layer 60 adopts a structural design as shown in FIG. 5, among them, the high refractive index adjustment layer 65 is made of a molybdenum selenide (MoSe2) material, and has a refractive index of 4.4; the low refractive index adjustment layer 64 is made of magnesium fluoride (MgF2) material, and has a refractive index of 1.38; and the number of stacked layers of the high refractive index adjustment layer 65 and the low refractive index adjustment layer 64 is three, namely, the number of the high refractive index adjustment layers 65 and the number of the low refractive index adjustment layers 64 are both three. The thicknesses of various film layers in the optical adjustment layer 60 from the back side to the light-facing side of the perovskite cell are listed in sequence in Table 1;

TABLE 1

| | Film layer | | | | | |
|---|---|---|---|---|---|---|
| | 1-$MgF_2$ | 1-$MoSe_2$ | 2-$MgF_2$ | 2-$MoSe_2$ | 3-$MgF_2$ | 3-$MoSe_2$ |
| Thickness/nm | 357 | 100 | 221 | 14 | 208 | 126 |

Figure 8:
FIG. 8 is a curve graph of the reflectivity of an optical adjustment layer according to an embodiment of the disclosure.

FIG. 8 is a curve graph of the reflectivity of an optical adjustment layer provided by an embodiment of the disclosure. Referring to FIG. 8, according to a theoretical calculation, the optical adjustment layer 60 can achieve an effect of an average reflectivity of infrared light being greater than 70%.

Example 3

The structure of the perovskite cell in the example is substantially the same as that of the perovskite cell in Example 1, and the only difference lies in that an up-conversion luminescence layer 80 is added between the second carrier transport layer 30 and the optical adjustment layer 60.

The material of the up-conversion luminescence layer 80 is $Yb^{+3}$ (20%) and $Er^{+3}$ (2%) co-doped sodium yttrium fluoride (NaYF4), the thickness is 400 nm, and the band gap thereof is about 8 electron volts. After two photons of 975 nm being absorbed, one photon of 650 nm was emitted, and the photon could be absorbed again by the perovskite light absorption layer 10, thereby improving the energy conversion efficiency of the perovskite cell.

Furthermore, an embodiment of the disclosure also provides a photovoltaic module including any perovskite cell as described above. An electrical connection component between the cells, an encapsulating material, a frame, and an external electrical connection component have the same or similar advantageous effects as the perovskite cell described above.

The embodiments of the disclosure have been described above with reference to the accompanying drawings, but the disclosure is not limited to the above-mentioned specific embodiments, which are merely illustrative and not restrictive. As taught by the disclosure, those skilled in the art would make many forms of the disclosure without departing from the spirit and scope of the disclosure as defined by the appended claims, and these forms fall within the scope of the disclosure.

The invention claimed is:

1. A perovskite cell, comprising:

a perovskite light absorption layer, a first carrier transport layer, a second carrier transport layer, a first transparent electrode layer, a second transparent electrode layer, and an optical adjustment layer;

wherein the first carrier transport layer is disposed on a light-facing side of the perovskite light absorption layer, the second carrier transport layer is disposed on a back side of the perovskite light absorption layer, and a carrier selectivity of the first carrier transport layer is opposite to the carrier selectivity of the second carrier transport layer;

the first transparent electrode layer is disposed on a side of the first carrier transport layer facing away from the perovskite light absorption layer, and the second transparent electrode layer is disposed on a side of the second carrier transport layer facing away from the perovskite light absorption layer;

the optical adjustment layer is disposed between the second carrier transport layer and the second transparent electrode layer, and the second transparent electrode layer is electrically connected to the second carrier transport layer, wherein a transmittance of the optical adjustment layer for visible light is greater than or equal to a preset transmittance, and a reflectivity of the optical adjustment layer for infrared light is greater than or equal to a preset reflectivity;

wherein the visible light is light with a wavelength less than a preset wavelength, the infrared light is light with a wavelength greater than or equal to the preset wavelength, the preset wavelength is in a range of 740 nm to 780 nm, the preset transmittance is 70~90%, and the preset reflectivity is 60~80%;

wherein the optical adjustment layer comprises at least one low refractive index adjustment layer and at least one high refractive index adjustment layer; the at least one low refractive index adjustment layer and the at least one high refractive index adjustment layer are arranged alternately; and wherein a refractive index of the at least one low refractive index adjustment layer is less than or equal to 1.7, and a refractive index of the at least one high refractive index adjustment layer is greater than or equal to 2.5.

2. The perovskite cell according to claim 1, wherein the preset transmittance is 80% and the preset reflectivity is 70%.

3. The perovskite cell according to claim 1, wherein:

the at least one low refractive index adjustment layer comprises a low refractive index material having a refractive index less than or equal to a first preset refractive index, the at least one high refractive index adjustment layer comprises a high refractive index material having a refractive index greater than or equal to a second preset refractive index, and the first preset refractive index is less than or equal to the second preset refractive index; and the refractive index of the low refractive index material and the high refractive index material, a thickness of the at least one low refractive index adjustment layer and the at least one high refractive index adjustment layer, and a number of the at least one low refractive index adjustment layer and the at least one high refractive index adjustment layer are determined according to a wavelength of the infrared light and the preset reflectivity.

4. The perovskite cell according to claim 3, wherein:

the low refractive index material comprises at least one of silicon oxide, silicon oxynitride, sodium fluoride, lithium fluoride, magnesium fluoride, and calcium fluoride; and the high refractive index material comprises at least one of silicon oxynitride, aluminum oxynitride, tungsten sulfide, molybdenum sulfide, lead sulfide, boron carbide, silicon carbide, aluminum antimonide, gallium antimonide, indium antimonide, bismuth selenide, molybdenum selenide, lead selenide, tungsten selenide, zinc telluride, lead telluride, and molybdenum telluride.

5. The perovskite cell according to claim 1, wherein:

a number of the at least one low refractive index adjustment layer and the at least one high refractive index adjustment layer is greater than or equal to 1 and less than or equal to 5.

6. The perovskite cell according to claim 1, further comprising an up-conversion luminescence layer;

wherein the up-conversion luminescence layer is arranged between the second carrier transport layer and the optical adjustment layer.

7. The perovskite cell according to claim 6, wherein a thickness of the up-conversion luminescence layer is less than or equal to 1000 nm;

a band gap of the up-conversion luminescence layer is greater than or equal to 3.0 electron volts.

8. The perovskite cell according to claim 1, further comprising a conductive structure;

wherein a via hole penetrating through the optical adjustment layer is provided in the optical adjustment layer, the conductive structure is arranged in the via hole of the optical adjustment layer, one end of the conductive structure is connected to the second carrier transport layer, and the other end of the conductive structure is connected to the second transparent electrode layer.

9. The perovskite cell according to claim 8, wherein the conductive structure comprises at least one of indium-doped tin oxide, aluminum-doped zinc oxide, a metal material, and a mixed material comprising a plurality of metals.

10. The perovskite cell according to claim 1, wherein the perovskite light absorption layer comprises at least one of an organic-inorganic halide perovskite, an all-inorganic perovskite, a lead-free perovskite, and a double perovskite;

a band gap of the perovskite light absorption layer is greater than or equal to 1.5 electron volts.

11. The perovskite cell according to claim 1, wherein the first transparent electrode layer and the second transparent electrode layer comprise at least one of an indium tin oxide conductive glass, a fluorine-doped tin dioxide conductive glass, and an aluminum-doped zinc oxide conductive glass;

the transmittance of the first transparent electrode layer and the second transparent electrode layer for the visible light is greater than 90%, and a square resistance of the second transparent electrode layer is less than or equal to 10 ohms/square.

12. A photovoltaic module comprising a perovskite cell, wherein the perovskite cell comprises:

a perovskite light absorption layer, a first carrier transport layer, a second carrier transport layer, a first transparent electrode layer, a second transparent electrode layer, and an optical adjustment layer;

wherein the first carrier transport layer is disposed on a light-facing side of the perovskite light absorption layer, the second carrier transport layer is disposed on a back side of the perovskite light absorption layer, and a carrier selectivity of the first carrier transport layer is opposite to the carrier selectivity of the second carrier transport layer;

the first transparent electrode layer is disposed on a side of the first carrier transport layer facing away from the perovskite light absorption layer, and the second transparent electrode layer is disposed on a side of the second carrier transport layer facing away from the perovskite light absorption layer;

the optical adjustment layer is disposed between the second carrier transport layer and the second transparent electrode layer, and the second transparent electrode layer is electrically connected to the second carrier transport layer, wherein a transmittance of the optical adjustment layer for visible light is greater than or equal to a preset transmittance, and a reflectivity of the optical adjustment layer for infrared light is greater than or equal to a preset reflectivity;

wherein the visible light is light with a wavelength less than a preset wavelength, the infrared light is light with a wavelength greater than or equal to the preset wavelength, the preset wavelength is in a range of 740 nm to 780 nm, the preset transmittance is 70~90%, and the preset reflectivity is 60~80%;

wherein the optical adjustment layer comprises at least one low refractive index adjustment layer and at least one high refractive index adjustment layer; the at least one low refractive index adjustment layer and the at least one high refractive index adjustment layer are arranged alternately; and wherein a refractive index of the at least one low refractive index adjustment layer is less than or equal to 1.7, and a refractive index of the at least one high refractive index adjustment layer is greater than or equal to 2.5.

* * * * *